United States Patent
Cheng et al.

(10) Patent No.: US 9,315,892 B2
(45) Date of Patent: Apr. 19, 2016

(54) METHOD AND APPARATUS FOR CONTROLLING BEAM ANGLE DURING ION IMPLANTATION OF A SEMICONDUCTOR WAFER BASED UPON PRESSURE

(71) Applicant: Taiwan Semiconductor Manufacturing Company Limited, Hsin-Chu (TW)

(72) Inventors: Nai-Han Cheng, Hsinchu (TW); Chi-Ming Yang, Hsinchu (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 13/839,328

(22) Filed: Mar. 15, 2013

(65) Prior Publication Data

US 2014/0273420 A1    Sep. 18, 2014

(51) Int. Cl.
*A61N 5/00* (2006.01)
*C23C 14/48* (2006.01)
*H01J 37/317* (2006.01)

(52) U.S. Cl.
CPC ............. *C23C 14/48* (2013.01); *H01J 37/3171* (2013.01); *H01J 2237/182* (2013.01)

(58) Field of Classification Search
CPC ....... H01J 37/00; H01J 37/3171; H01J 37/36; H01J 37/317; H01J 37/3172; H01J 2237/31701; H01J 2237/3365; H01L 21/046; H01L 21/22; H01L 21/265; H01L 21/24; H01L 21/28052; H01L 21/00; H01L 21/2253; H01L 21/2652; H01L 21/2656; H01L 21/2822; H01L 21/31155; H01L 21/76859

USPC ................. 250/492.1, 492.2, 492.21, 492.22, 250/492.23, 492.3
See application file for complete search history.

(56) References Cited

U.S. PATENT DOCUMENTS

| | | | |
|---|---|---|---|
| 5,672,882 A * | 9/1997 | Day et al. ................. | 250/492.21 |
| 2002/0130277 A1 * | 9/2002 | Halling .................... | 250/492.21 |
| 2004/0002202 A1 * | 1/2004 | Horsky et al. ................. | 438/515 |
| 2007/0069157 A1 * | 3/2007 | Mehta et al. ............. | 250/492.21 |
| 2007/0181830 A1 * | 8/2007 | Horsky et al. ............ | 250/492.21 |

(Continued)

FOREIGN PATENT DOCUMENTS

| | | |
|---|---|---|
| KR | 1020080012374 | 2/2008 |
| WO | 2007013869 A1 | 2/2007 |

OTHER PUBLICATIONS

Corresponding Korean application 10-2013-0137312, Korean Office action dated Feb. 27, 2015, 11 pages.

(Continued)

*Primary Examiner* — Nicole Ippolito
*Assistant Examiner* — Jason McCormack
(74) *Attorney, Agent, or Firm* — Cooper Legal Group, LLC (57) ABSTRACT

One or more techniques or systems for ion implantation are provided herein. A pressure control module is configured to maintain a substantially constant pressure within an ion implantation or process chamber. Pressure is maintained based on an attribute of an implant layer, pressure data, feedback, photo resist (PR) outgassing, a PR coating rate, a space charge effect associated with the implant layer, etc. By maintaining pressure within the process chamber, effects associated with PR outgassing are mitigated, thereby mitigating neutralization of ions. By maintaining charged ions, better control over implantation of the ions is achieved, thus allowing ions to be implanted at a desired depth.

20 Claims, 5 Drawing Sheets

(56) References Cited

U.S. PATENT DOCUMENTS

| | | | |
|---|---|---|---|
| 2007/0212896 A1* | 9/2007 | Olsen et al. | 438/758 |
| 2008/0078958 A1* | 4/2008 | Zhu | 250/492.21 |
| 2008/0087844 A1* | 4/2008 | Nunan et al. | 250/492.2 |
| 2008/0230724 A1* | 9/2008 | Low | H01J 37/05 250/492.21 |
| 2012/0329256 A1* | 12/2012 | Ito et al. | 438/514 |

OTHER PUBLICATIONS

Corresponding Korean application 10-2013-0137312, Korean Office action dated Jul. 7, 2015 11 pages.

Corresponding Taiwan Office Action dated May 25, 2015, 8 pages.

* cited by examiner

METHOD AND APPARATUS FOR CONTROLLING BEAM ANGLE DURING ION IMPLANTATION OF A SEMICONDUCTOR WAFER BASED UPON PRESSURE

BACKGROUND

Generally, implantation involves doping in silicon technology, which is associated with dosage control, ion beam incident angles, and controlling various impurities in silicon with a desired doping profile. Ions are accelerated and decelerated to a kinetic energy level and directed towards a surface of a target, such as a wafer. Depending on the type of impurity and the kinetic energy level, an implant depth is determined. However, a random doping variation becomes more significant with advanced technology.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more techniques or systems for controlling drive current uniformity of a wafer are provided herein. In some embodiments, an ion beam implant system comprises a process chamber where implanting generally occurs. The process chamber is often set at a low vacuum pressure, such as less than $10^{-7}$ torr. During implanting, a wafer or target within the process chamber is coated with a layer of photo resist (PR). Sometimes PR outgassing occurs during implantation when an ion beam hits the PR, for example. As a result of the PR outgassing, a residual gas concentration and a number of slow, positively charged ions, such as hydrogen ions ($H^+$), within the process chamber increases. It will be appreciated that PR outgassing is associated with an increase in vacuum pressure within the process chamber because the residual gas concentration and number of slow ions is increased. In some instances ions from the ion beam collide with the residual gas from the PR outgassing, thereby becoming neutrally charged. When ions from the ion beam are neutrally charged, a decel module is often unable to decelerate ions from the ion beam to a desired energy level, thus inhibiting an ability to control implantation of the neutrally charged particles to a desired depth. Accordingly, according to some embodiments herein, a pressure control module is configured to maintain a substantially constant pressure within the process chamber, thereby mitigating effects associated with PR outgassing. The pressure control module maintains the substantially constant pressure based on one or more of pressure data associated with at least one of an implant layer, a technology associated with the implant layer, photo resist (PR) outgassing, a PR coating rate associated with the implant layer, or a space charge effect associated with the implant layer. Ions from the ion beam are more likely to be decelerated to a desired second energy level because the pressure control module reduces the availability of residual gas with which ions collide to become neutrally charged, where the decal module has little to no effect on neutrally charged particles.

The following description and annexed drawings set forth certain illustrative aspects and implementations. These are indicative of but a few of the various ways in which one or more aspects are employed. Other aspects, advantages, or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

Embodiments or examples, illustrated in the drawings are disclosed below using specific language. It will nevertheless be understood that the embodiments or examples are not intended to be limiting. Any alterations and modifications in the disclosed embodiments, and any further applications of the principles disclosed in this document are contemplated as would normally occur to one of ordinary skill in the pertinent art.

It will be appreciated that 'layer', as used herein, contemplates a region, and does not necessarily comprise a uniform thickness. For example, a layer is a region, such as an area comprising arbitrary boundaries. For another example, a layer is a region comprising at least some variation in thickness.

Figure 1:
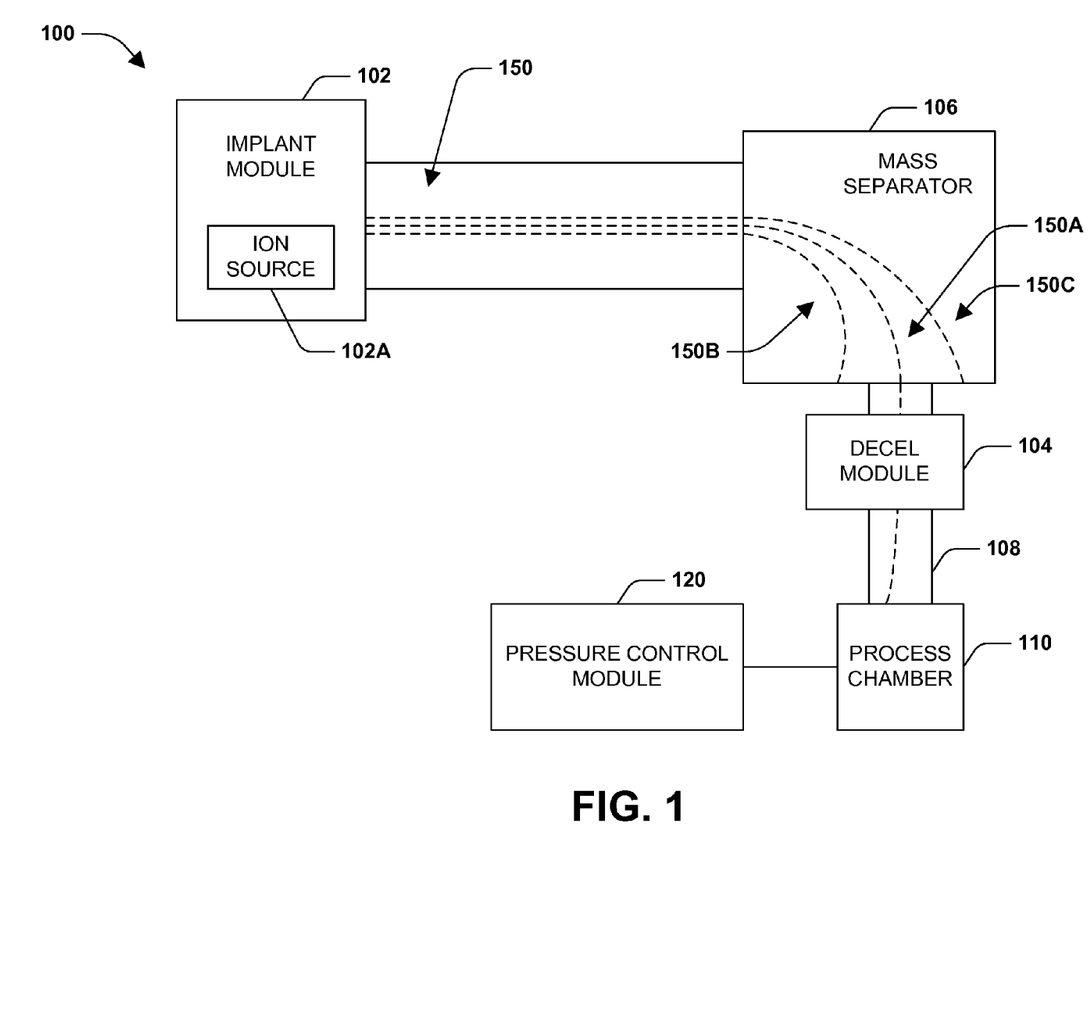
FIG. 1 is a schematic diagram of an example ion beam implant system, according to some embodiments.

FIG. 1 is a schematic diagram of an example ion beam implant system 100, according to some embodiments. The ion beam implant system 100 comprises an implant module 102, a decel module 104, a mass separator 106, a process chamber 110, and a pressure control module 120. The ion beam implant system 100 is configured to accelerate charged dopants, such as ions, through an electric field and onto a target, such as a wafer within the process chamber 110. The implant module 102 is configured to accelerate one or more ions from an ion source 102A to a first energy level. For example, the implant module 102 may accelerate ions from the ion source 102A to about 2.5 keV. It will be appreciated that a doping depth is associated with this energy level. For example, a higher energy level is generally associated with a deeper doping depth because ions at the higher energy level have a relatively high velocity and momentum, thereby being embedded at a deeper doping depth than low velocity and momentum ions. In scenarios where a shallower doping depth is desired, a decel module 104 is configured to decelerate at least some ions of an ion beam 150 to a second energy level lower than the first energy level. For example, the decel module 104 is configured to decelerate at least some ions of the ion beam from about 2.5 keV to 0.5 keV. This enables the ion beam implant system 100 to implant a wafer within the process chamber 110 with ions at a desired doping depth.

In some embodiments, the ion source 102A comprises ionized dopants in a gaseous state, such as boron or arsenic, for example. The implant module 102 may comprise one or more lenses configured to focus at least some of the one or more ions from the ion source 102A into an ion beam at 150. At 150, however, the ion beam may comprise one or more undesired impurities, such as particle byproducts. A mass separator 106 is configured to deflect or filter one or more particles from the ion beam 150 using a magnetic field. As an example, when an ion source comprises boron trifluoride ($BF_3$), the implant module 102 produces an ion beam 150 comprising one or more boron ions ($B^+$) and one or more particles that are byproducts from ionization, such as $BF_2^+$, $BF^+$, etc. In this scenario, the mass separator 106 is configured to deflect the $BF_2^+$ and $BF^+$ particles at 150B and 150C. In this way, ion beam 150A comprises primarily positively charged boron ions ($B^+$). In other words, the mass separator 106 is configured to deflect particles that are heavier or lighter than desired ions, such as the positively charged boron ions and provide a desired ion beam at 150A.

It will be appreciated that in some embodiments, the mass separator 106 is downstream from a module configured for ion acceleration, such as the implant module 102, while in other embodiments, an acceleration module is downstream from the mass separator 106. Similarly, in some embodiments, the mass separator 106 is downstream from the decel module 104 or vice versa. The ion beam implant system 100 comprises one or more electroplates 108 or deflectors configured to deflect the ion beam 150A to a desired location on a wafer housed within the process chamber 110. The electroplates 108 are configured to control a beam angle associated with the ion beam downstream from the mass separator 106.

Generally, regions of a wafer that are not to be doped are covered with a layer of photo resist (PR) and/or a layer of sacrificial material, such as silicon oxide or silicon nitride. Additionally, the process chamber 110 associated with ion implantation is often at a low vacuum pressure, such as a pressure less than $10^{-7}$ torr. Ions of the ion beam 150A will impact the covered portions of the wafer that are not to be doped or implanted. When the covering is PR, outgassing occurs. For example, PR outgassing is a result of the ion beam bombarding and heating up the PR. PR outgassing creates moisture, slow hydrogen ions ($H^+$), or other residual gasses within the process chamber 110, which results in an increase in pressure within the process chamber. Often, when the moisture, slow hydrogen ions, residual gases, etc. make their way upstream, they collide with particles from ion beam 150, 150A, 150B, or 150C. As a result, at least some of the ions from the ion beam 150, 150A, 150B, or 150C may become neutrally charged. As an example, when an ion source comprises arsenic and PR outgassing occurs, positively charged arsenic ions become neutrally charged as follows:

$$As^+ + H^0 \rightarrow As^0 + H^+ + e^-$$

The PR outgassing causes ions to have a higher possibility of hitting residual gas, such as hydrogen, and losing a positive charge. When ions become neutrally charged, a decel module 104 is generally unable to decelerate ions to a second or desired energy level. Additionally, electrons produced by PR outgassing often have a space charge impact on an ion beam. For example, a high concentration of electrons causes the ion beam to disperse in some instances. According to various embodiments, a pressure control module 120 is therefore configured to maintain a substantially constant pressure within the process chamber 110. For example, the pressure control module 120 is configured to mitigate at least one of a pressure increase or a pressure decrease associated with the environment of the process chamber 110.

The pressure control module 120 is configured to maintain the substantially constant pressure within the process chamber 110 based on an attribute of a layer of a wafer being implanted with ions. In other words, the pressure control module 120 can use data, such as historical pressure data to compensate for increases or decreases in the pressure within the process chamber 110. As an example, if historical pressure data indicates that the pressure within the process chamber 110 increases more during ion implantation of a specific layer, the pressure control module 120 is configured to decrease the pressure of the process chamber by an amount associated with the specific layer. Additionally, if historical pressure data indicates that the pressure within the process chamber 110 increases or spikes at a time after implantation is started, the pressure control module 120 will adjust the pressure within the process chamber accordingly, such as at a corresponding time associated with the spike, for example. In this way, the pressure control module 120 is configured to mitigate at least one of the increase in the residual gas concentration or the increase in the pressure within the process chamber 110.

In some embodiments, the pressure control module 120 is configured to maintain a substantially constant pressure based on feedback from the process chamber. For example, after ion implantation begins, a residual gas concentration within the process chamber 110 is monitored, and the pressure control module 120 adjusts the pressure within the process chamber 110 accordingly. In some embodiments, a current pressure within the process chamber 110 is measured, and the pressure control module 120 is configured to adjust the pressure of the process chamber 110 accordingly, such as if the current pressure is higher than a starting pressure or a desired pressure. As another example, the pressure control module 120 maintains or controls the pressure within the process chamber 110 based on pressure data from a pressure database. The pressure data is historical pressure data indicative of how pressure changes over time across one or more implant layers of a wafer, PR outgassing for an implant layer, residual gas concentration for an implant layer, a technology, such as a chemical composition, a thickness, density, attribute, etc., associated with an implant layer, a PR coating rate for an implant layer, or a space charge effect associated with the implant layer. It will be appreciated that an implant layer is generally a topmost layer on the wafer, which includes a covering layer, such as a layer of PR, sacrificial oxide, etc., and exposed underlying layers, such as layers comprising a desired implant area, for example. An implant or topmost layer thus includes both a covering layer, such as a layer of PR, and an exposed portion of an underlying layer, such as silicon to be implanted, etc. It will be appreciated that implant or topmost layers may vary from wafer to wafer. For example, about 80% of a first wafer may be covered with PR and have about 20% exposed silicon, while about 20% of a second wafer may be covered with PR and have about 80% exposed silicon. It will be appreciated different pressures, for example, would be used to achieve a doping profile that is uniform, or substantially uniform, across both the first wafer and the second wafer, given the differences in the implant layers on the first and second wafers. That is, a first pressure would be used to achieve a particular doping profile for the first wafer and a second pressure would be used to achieve the same, or substantially same, particular doping profile for the second wafer.

By mitigating an increase in pressure or a residual gas concentration within the process chamber 110, the pressure control module 120 reduces the availability of residual gas, such as hydrogen ions, with which ions of ion beam 150, 150A, 150B, or 150C collide to produce neutralized particles. Because collisions between residual gasses and ions are mitigated, the ions remain positively charged, and are thus decelerated to a second, desired energy level by the decel module 104. Accordingly, the decel module 104 is therefore able to decelerate at least some additional ions, at least because the pressure control module 120 mitigates at least some of the one or more ions from at least one of losing a positive charge or becoming neutrally charged. In this way, the pressure control module 120 is configured to mitigate a charge exchange effect associated with at least some of the one or more ions of the ion beam. In some embodiments, when the decel module 104 decelerates at least some additional ions, a desired implant or dopant depth and drive current uniformity is achieved. Therefore, the pressure control module 120 is configured to mitigate at least one of energy contamination (EC) associated with an energy level higher than the second, desired energy level, undesirable dopant depth or a space charge effect associated with a beam angle variation of an ion beam, for example. As a result, ion implantation occurs at a desired doping depth associated with the second or desired energy level.

Figure 2:
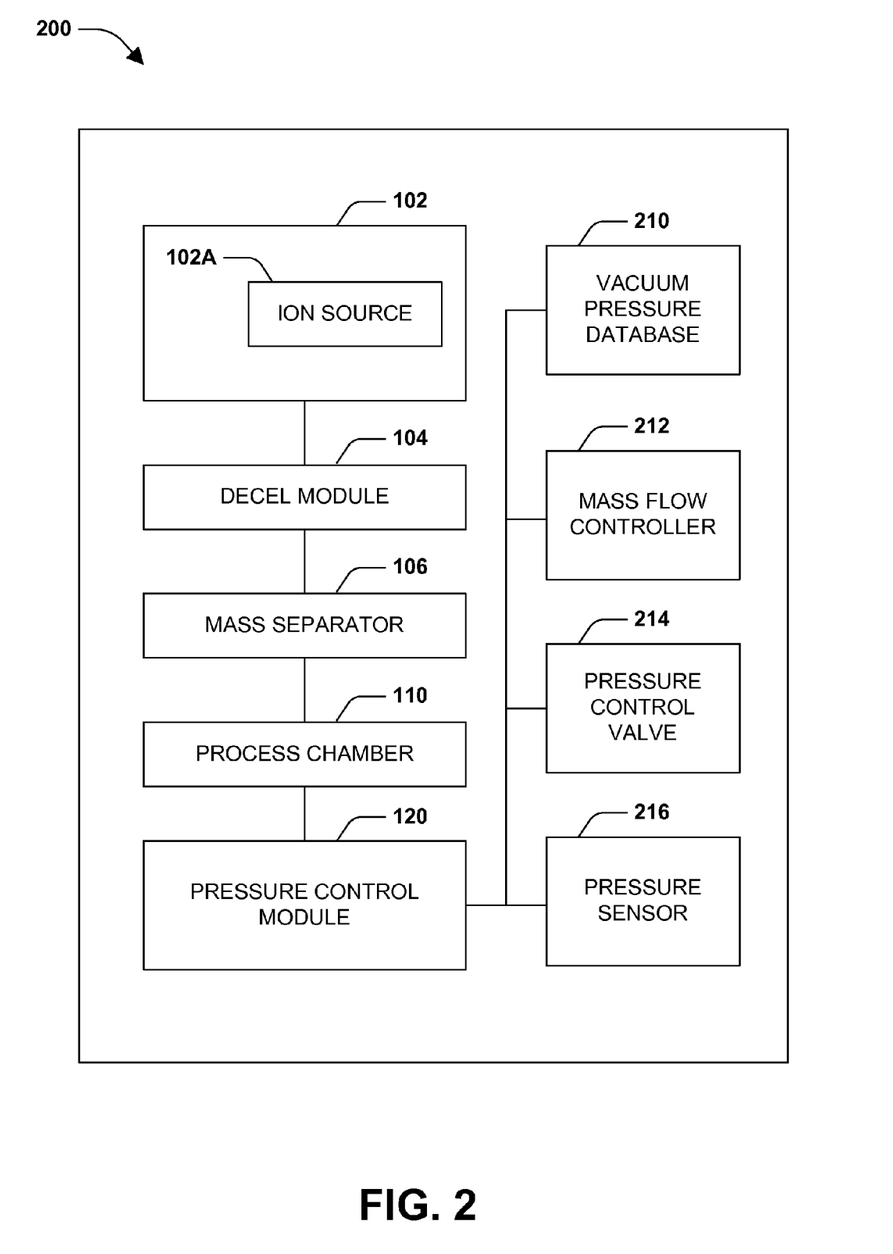
FIG. 2 is a schematic diagram of an example ion beam implant system, according to some embodiments.

FIG. 2 is a schematic diagram of an example ion beam implant system 200, according to some embodiments. It will be appreciated that FIG. 2 is similar to FIG. 1, except that the ion beam implant system 200 of FIG. 2 comprises one or more additional components, such as a vacuum pressure database 210, a mass flow controller 212, a pressure control valve 214, and a pressure sensor 216, for example. In some embodiments, the decel module 104 of FIG. 2 is downstream from the implant module 102, and the mass separator 106 is downstream from the decel module 104. In some embodiments, the decel module 104 is downstream from the mass separator 106.

In some embodiments, the ion beam implant system 200 comprises a vacuum pressure database 210. In some embodiments, the vacuum pressure database 210 comprises pressure data associated with at least one of a relative implant layer, a technology associated with the implant layer, photo resist (PR) outgassing, a PR coating rate associated with a specific implant layer, or a space charge effect associated with the implant layer. An implant layer is a layer associated with a stage of semiconductor processing or fabrication within the process chamber 110. In some embodiments, the pressure data associated with PR outgassing is based on an increase in a residual gas concentration at least due to an ion beam bombarding PR on a wafer, for example. In some embodiments, the pressure data associated with the space charge effect is based on one or more adjustments to an electro plate for ion beam refocusing. The pressure control module 120 is configured to at least one of maintain or control a pressure within the process chamber 110 based on at least some of the pressure data of the vacuum pressure database 210. In some embodiments, the pressure control module 120 is configured to maintain a substantially constant pressure within the process chamber 110 based on at least some of the pressure data.

In some embodiments, the ion beam implant system 200 comprises a mass flow controller (MFC) 212 configured to control media flow at least one of to the process chamber 110 or from the process chamber 110. In some embodiments, the MFC 212 is controlled by the pressure control module 120. Generally, the MFC 212 is configured to measure and control the flow of media, such as fluids and gases, to and from the process chamber 110. The MFC 212 may comprise an inlet port, an outlet port, a mass flow sensor, and a proportional control valve. In some embodiments, the MFC 212 comprises a closed loop or feedback control system configured to compare a desired flow level to a flow level from the mass flow sensor and adjust the proportional control valve accordingly. In some embodiments, a controller, such as the MFC 212, is configured to select a substantially constant pressure from a vacuum pressure database comprising pressure data associated with at least one of an implant layer, a technology associated with the implant layer, properties of the implant layer, photo resist (PR) outgassing, a PR coating rate associated with the implant layer, or a space charge effect associated with the implant layer.

In some embodiments, the ion beam implant system 200 comprises a pressure control valve (PCV) 214 configured to facilitate maintenance of the substantially constant pressure within the process chamber 110. In some embodiments, the PCV 214 is controlled by the pressure control module 120. For example, the PCV 214 is a valve configured to shut off at a certain pressure. In some embodiments, the ion beam implant system 200 comprises a pressure sensor 216 configured to measure a current pressure of the process chamber 110. In some embodiments, the pressure control module 120 is configured to maintain a pressure of the process chamber 110 based on the current pressure of the process chamber 110. In some embodiments, the pressure control module 120 is configured to maintain the substantially constant pressure within the process chamber 110 based on photo resist (PR) outgassing feedback. In some embodiments, the ion beam implant system 200 comprises one or more electroplates configured to control a beam angle associated with the ion beam 204 based on pressure data from the vacuum pressure database 210.

Figure 3:
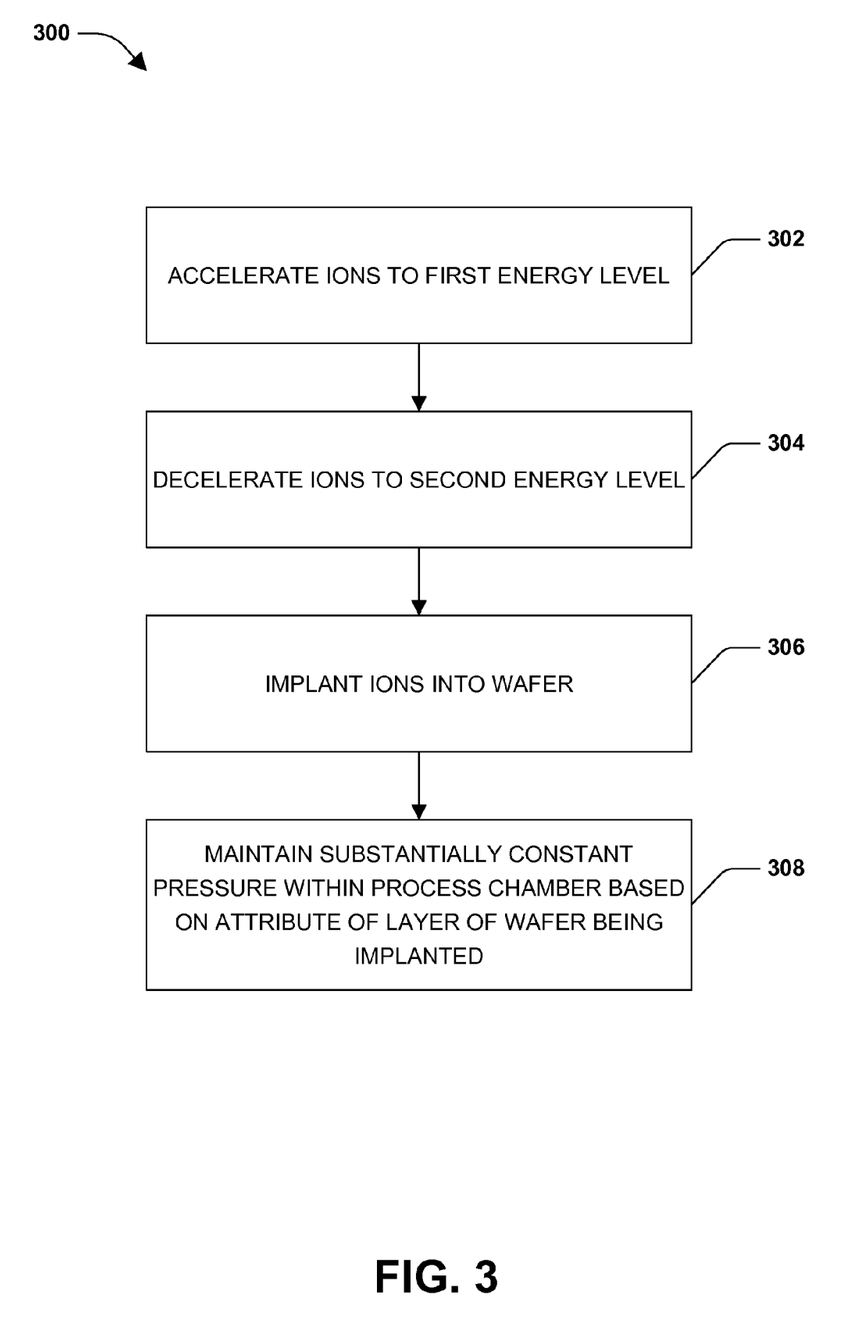
FIG. 3 is a flow diagram of an example method for performing ion implantation, according to some embodiments.

FIG. 3 is a flow diagram of an example method 300 for performing ion implantation, according to some embodiments. In some embodiments, the method 300 comprises accelerating one or more ions to a first energy level at 302. In some embodiments, the method 300 comprises decelerating at least some of the one or more ions to a second energy level at 304. In some embodiments, the method 300 comprises implanting at least some of the one or more ions into a wafer at 306. In some embodiments, the method 300 comprises maintaining a substantially constant pressure based on an attribute of a layer of the wafer being implanted with at least some of the one or more ions, thereby controlling drive current uniformity associated with the wafer at 308. In some embodiments, the method 300 comprises maintaining the substantially constant pressure based on photo resist (PR) outgassing feedback. In some embodiments, a substantially constant pressure is maintained based on pressure data associated with at least one of a specific implant layer, a technology associated with the implant layer, photo resist (PR) outgassing, a PR coating rate associated with the implant layer, a space charge effect associated with the implant layer, or a current pressure within the environment. By maintaining pressure within the process chamber, effects associated with PR outgassing are mitigated, thereby promoting deceleration of ions, and thus enhancing drive current uniformity. In this way, drive current uniformity associated with the wafer is enhanced.

Figure 4:
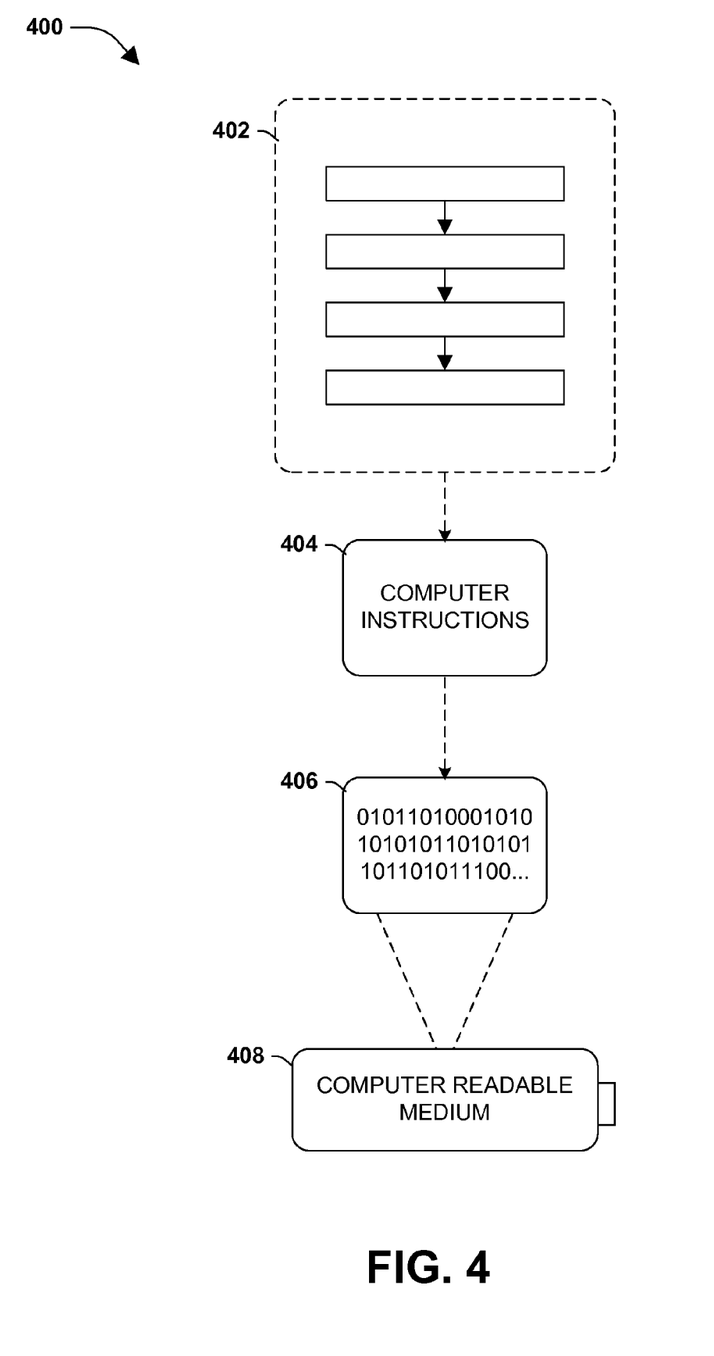
FIG. 4 is an illustration of an example computer-readable medium or computer-readable device comprising processor-executable instructions configured to embody one or more of the provisions set forth herein, according to some embodiments.

Still another embodiment involves a computer-readable medium comprising processor-executable instructions configured to implement one or more of the techniques presented herein. An example embodiment of a computer-readable medium or a computer-readable device that is devised in these ways is illustrated in FIG. 4, wherein an implementation 400 comprises a computer-readable medium 408, such as a CD-R, DVD-R, flash drive, a platter of a hard disk drive, etc., on which is encoded computer-readable data 406. This computer-readable data 406, such as binary data comprising a plurality of zero's and one's as shown in 406, in turn comprises a set of computer instructions 404 configured to operate according to one or more of the principles set forth herein. In one such embodiment 400, the processor-executable computer instructions 404 are configured to perform a method 402, such as at least some of the exemplary method 300 of FIG. 3, for example. In another embodiment, the processor-executable instructions 404 are configured to implement a system, such as at least some of at least one of the exemplary system 100 of FIG. 1 or at least some of the exemplary system 200 of FIG. 2, for example. Many such computer-readable media are devised by those of ordinary skill in the art that are configured to operate in accordance with the techniques presented herein.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

As used in this application, the terms "component", "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, or a computer. By way of illustration, both an application running on a controller and the controller can be a component. One or more components residing within a process or thread of execution and a component may be localized on one computer or distributed between two or more computers.

Furthermore, the claimed subject matter is implemented as a method, apparatus, or article of manufacture using standard programming or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, many modifications may be made to this configuration without departing from the scope or spirit of the claimed subject matter.

Figure 5:
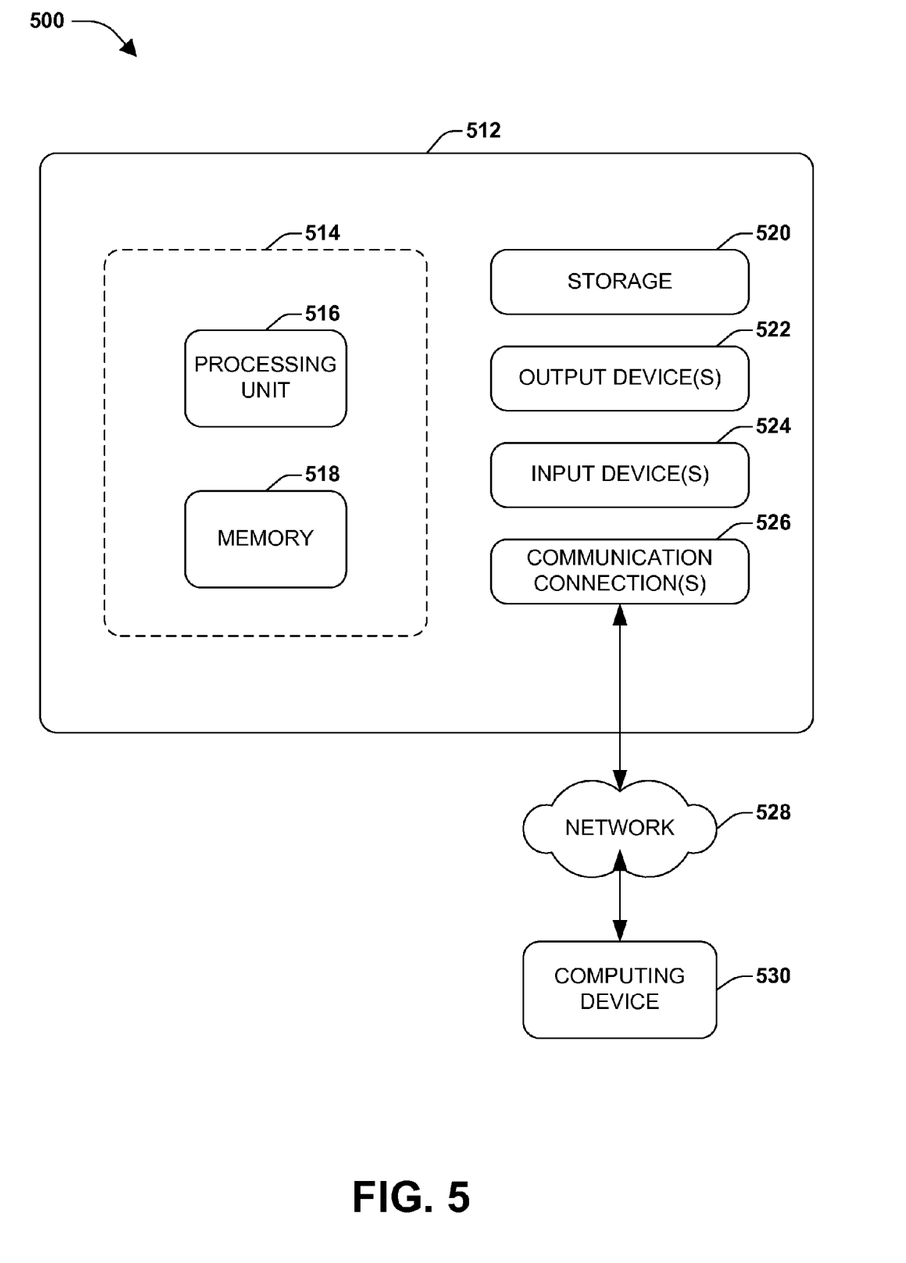
FIG. 5 is an illustration of an example computing environment where one or more of the provisions set forth herein are implemented, according to some embodiments.

FIG. 5 and the following discussion provide a description of a suitable computing environment to implement embodiments of one or more of the provisions set forth herein. The operating environment of FIG. 5 is only one example of a suitable operating environment and is not intended to suggest any limitation as to the scope of use or functionality of the operating environment. Example computing devices include, but are not limited to, personal computers, server computers, hand-held or laptop devices, mobile devices, such as mobile phones, Personal Digital Assistants (PDAs), media players, and the like, multiprocessor systems, consumer electronics, mini computers, mainframe computers, distributed computing environments that include any of the above systems or devices, and the like.

Generally, embodiments are described in the general context of "computer readable instructions" being executed by one or more computing devices. Computer readable instructions are distributed via computer readable media as will be discussed below. Computer readable instructions are implemented as program modules, such as functions, objects, Application Programming Interfaces (APIs), data structures, and the like, that perform particular tasks or implement particular abstract data types. Typically, the functionality of the computer readable instructions are combined or distributed as desired in various environments.

FIG. 5 illustrates an example of a system 500 comprising a computing device 512 configured to implement one or more embodiments provided herein. In one configuration, computing device 512 includes at least one processing unit 516 and memory 518. Depending on the exact configuration and type of computing device, memory 518 may be volatile, such as RAM, non-volatile, such as ROM, flash memory, etc., or some combination of the two. This configuration is illustrated in FIG. 5 by dashed line 514.

In other embodiments, device 512 includes additional features or functionality. For example, device 512 also includes additional storage such as removable storage or non-removable storage, including, but not limited to, magnetic storage, optical storage, and the like. Such additional storage is illustrated in FIG. 5 by storage 520. In some embodiments, computer readable instructions to implement one or more embodiments provided herein are in storage 520. Storage 520 also stores other computer readable instructions to implement an operating system, an application program, and the like. Computer readable instructions are loaded in memory 518 for execution by processing unit 516, for example.

The term "computer readable media" as used herein includes computer storage media. Computer storage media includes volatile and nonvolatile, removable and non-removable media implemented in any method or technology for storage of information such as computer readable instructions or other data. Memory 518 and storage 520 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 512. Any such computer storage media is part of device 512.

The term "computer readable media" includes communication media. Communication media typically embodies computer readable instructions or other data in a "modulated data signal" such as a carrier wave or other transport mechanism and includes any information delivery media. The term "modulated data signal" includes a signal that has one or more of its characteristics set or changed in such a manner as to encode information in the signal.

Device 512 includes input device(s) 524 such as keyboard, mouse, pen, voice input device, touch input device, infrared cameras, video input devices, or any other input device. Output device(s) 522 such as one or more displays, speakers, printers, or any other output device are also included in device 512. Input device(s) 524 and output device(s) 522 are connected to device 512 via a wired connection, wireless connection, or any combination thereof. In some embodiments, an input device or an output device from another computing device are used as input device(s) 524 or output device(s) 522 for computing device 512. Device 512 also includes communication connection(s) 526 to facilitate communications with one or more other devices, such as over a network 528 with one or more other computing devices 530.

According to some embodiments, a method of ion implantation is provided. The method includes accelerating one or more ions to a first energy level, and implanting at least some of the one or more ions into a wafer. The method also includes maintaining a substantially constant pressure within a process chamber for implanting at least some of the one or more ions, wherein the substantially constant pressure is determined based on an attribute of a layer of the wafer being implanted with at least some of the one or more ions.

According to some embodiments, an ion beam implant system is provided. The system includes an implant module configured to accelerate one or more ions of an ion source to a first energy level, and a decel module downstream of the implant module configured to decelerate at least some of the one or more ions to a second energy level. The system also includes a mass separator downstream of the implant module configured to filter one or more particles from the one or more ions, and a process chamber downstream of the mass separator configured to receive at least some of the one or more ions. The system also includes a pressure control module configured to maintain a substantially constant pressure within the process chamber based on an attribute of a layer of a wafer being implanted with at least some of the one or more ions.

According to some embodiments, an ion beam implant system is provided. The system includes an implant module configured to accelerate one or more ions of an ion source to a first energy level, the implant module comprising one or more lenses configured to focus at least some of the one or more ions into an ion beam. The system also includes a decel module downstream of the implant module configured to decelerate at least some of the one or more ions of the ion beam to a second energy level. The system includes a process chamber downstream of the decel module configured to receive at least some of the one or more ions of the ion beam, and a pressure control module configured to maintain a substantially constant pressure within the process chamber. The system further includes a controller configured to select the substantially constant pressure from a vacuum pressure database, said selection based on properties of an implant layer.

Various operations of embodiments are provided herein. The order in which some or all of the operations are described should not be construed as to imply that these operations are necessarily order dependent. Alternative ordering will be appreciated based on this description. Further, it will be understood that not all operations are necessarily present in each embodiment provided herein.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising". Further, unless specified otherwise, "first," "second," or the like are not intended to imply a temporal aspect, a spatial aspect, an ordering, etc. Rather, such terms are merely used as identifiers, names, etc. for features, elements, items, etc. For example, "a first channel and a second channel" generally correspond to "channel A and channel B," where channel A and channel B are two different channels two identical channels or the same channel.

Also, although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. A method of ion implantation, comprising:
   determining a set of implant parameters for an implant layer of a wafer being implanted with ions;
   accelerating one or more ions to a first energy level based on the set of implant parameters;
   implanting, within a process chamber, at least some of the one or more ions into the implant layer of the wafer; and
   measuring a pressure within the process chamber, wherein:
   the implanting comprises controlling a beam angle, associated with at least some of the one or more ions, via an electroplate based upon the pressure within the process chamber.

2. The method of claim 1, further comprising maintaining a substantially constant pressure within the process chamber during the implanting, the maintaining comprising reducing the pressure within the process chamber when the pressure exceeds a specified pressure threshold.

3. The method of claim 2, the maintaining comprising:
   maintaining the substantially constant pressure based on pressure data associated with at least one of the implant layer, a technology associated with the implant layer, photo resist (PR) outgassing, a PR coating rate associated with the implant layer, or a space charge effect associated with the implant layer.

4. An ion beam implant system, comprising:
   an implant module configured to accelerate one or more ions of an ion source to a first energy level;
   a decel module downstream of the implant module configured to decelerate at least some of the one or more ions to a second energy level;
   a mass separator downstream of the implant module configured to filter one or more particles from the one or more ions;
   a process chamber downstream of the mass separator configured to receive at least some of the one or more ions;
   a pressure sensor configured to determine a pressure within the process chamber; and
   an electroplate configured to control a beam angle, associated with at least some of the one or more ions, based on the pressure.

5. The ion beam implant system of claim 4, further comprising a pressure control module configured to maintain a substantially constant pressure within the process chamber.

6. The ion beam implant system of claim 4, further comprising a mass flow controller (MFC) configured to control flow at least one of to the process chamber or from the process chamber.

7. The ion beam implant system of claim 5, further comprising a controller configured to select the substantially constant pressure from a vacuum pressure database comprising pressure data associated with at least one of an implant layer being implanted with at least some of the one or more ions, a technology associated with the implant layer, photo resist (PR) outgassing, a PR coating rate associated with the implant layer, or a space charge effect associated with the implant layer.

8. The ion beam implant system of claim 4, wherein the pressure sensor is configured to determine the pressure within the process chamber based on historical pressure data for implant layers of a type corresponding to an implant layer being implanted with at least some of the one or more ions.

9. The ion beam implant system of claim 4, wherein the pressure sensor is configured to determine the pressure within the process chamber based on a residual gas concentration within the process chamber.

10. The ion beam implant system of claim 4, wherein the pressure sensor is configured to measure the pressure within the process chamber.

11. The ion beam implant system of claim 10, further comprising a pressure control module configured to adjust the pressure within the process chamber based on a measured pressure within the process chamber.

12. The ion beam implant system of claim 4, wherein the implant module comprises one or more lenses configured to focus at least some of the one or more ions into an ion beam.

13. The ion beam implant system of claim 12, wherein the electroplate is configured to control the beam angle associated with the ion beam.

14. An ion beam implant system, comprising:
an implant module configured to accelerate one or more ions of an ion source to a first energy level;
a process chamber downstream of the implant module configured to receive at least some of the one or more ions;
a pressure sensor configured to determine a pressure within the process chamber; and
an electroplate configured to control a beam angle, associated with at least some of the one or more ions, based on the pressure.

15. The ion beam implant system of claim 14, further comprising a decel module downstream of the implant module configured to decelerate at least some of the one or more ions to a second energy level.

16. The ion beam implant system of claim 14, further comprising a mass separator downstream of the implant module and upstream of the process chamber, the mass separator configured to filter one or more particles from the one or more ions.

17. The ion beam implant system of claim 14, further comprising a pressure control module configured to maintain a substantially constant pressure within the process chamber.

18. The ion beam implant system of claim 14, wherein the pressure sensor is configured to determine the pressure within the process chamber based on a residual gas concentration within the process chamber.

19. The ion beam implant system of claim 14, wherein the pressure sensor is configured to measure the pressure within the process chamber.

20. The ion beam implant system of claim 19, further comprising a pressure control module configured to adjust the pressure within the process chamber based on a measured pressure within the process chamber.

* * * * *